US006947331B1

(12) United States Patent
Mirgorodski et al.

(10) Patent No.: US 6,947,331 B1
(45) Date of Patent: Sep. 20, 2005

(54) METHOD OF ERASING AN EEPROM CELL UTILIZING A FREQUENCY/TIME DOMAIN BASED ERASED SIGNAL

(75) Inventors: Yuri Mirgorodski, Sunnyvale, CA (US); Vladislav Vashchenko, Palo Alto, CA (US); Peter J. Hopper, San Jose, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/665,187

(22) Filed: Sep. 17, 2003

Related U.S. Application Data

(60) Provisional application No. 60/479,209, filed on Jun. 16, 2003.

(51) Int. Cl.[7] ............................................... G11C 11/34

(52) U.S. Cl. ............................ 365/185.29; 365/185.18

(58) Field of Search ....................... 365/185.29, 185.18

(56) References Cited

U.S. PATENT DOCUMENTS 4,698,787 A 10/1987 Mukherjee et al. ......... 365/185
6,026,014 A * 2/2000 Sato et al. ............. 365/185.03
6,111,288 A * 8/2000 Watanabe et al. ........... 257/321
6,137,723 A 10/2000 Bergemont et al. .... 365/185.18

* cited by examiner

*Primary Examiner*—Michael Tran
(74) *Attorney, Agent, or Firm*—Stallman & Pollock LLP

(57) ABSTRACT

A method is provided for erasing a nonvolatile memory cell that includes a source region, a drain region, a floating gate electrode and a control gate electrode to which an erase signal is applied. In accordance with the method, a source bias voltage is applied to the source region, a drain bias voltage is applied to the drain region, and a frequency/time domain based voltage signal is applied to the control gate electrode of the cell as the erase signal.

3 Claims, 5 Drawing Sheets

METHOD OF ERASING AN EEPROM CELL UTILIZING A FREQUENCY/TIME DOMAIN BASED ERASED SIGNAL

RELATED APPLICATION

The present application claims the benefit of U.S. Provisional Patent Application No. 60/479,209, filed Jun. 16, 2003.

FIELD OF THE INVENTION

The present invention relates to non-volatile memory (NVM) cells and, in particular, to a method of erasing an electrically erasable programmable read only memory (EEPROM) cell utilizing a frequency/time domain based signal, such as a pulsed signal or an RF signal, as the erase signal to the cell's control gate.

DESCRIPTION OF THE INVENTION

Figure 1:
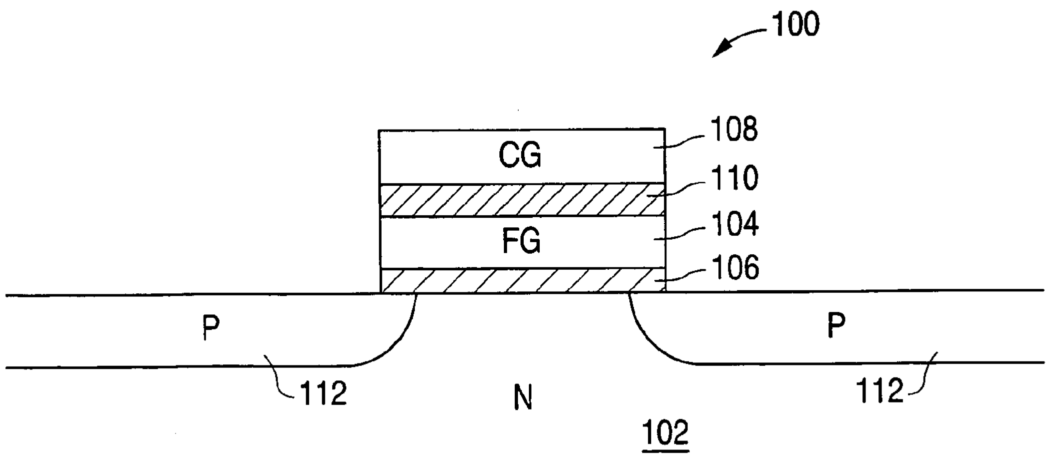
FIG. 1 is a partial cross-section drawing illustrating the general structure of a PMOS stacked gate NVM cell.

FIG. 1 provides a general schematic representation of a conventional PMOS stacked gate NVM cell 100 formed in an N-type region 102 of semiconductor material, e.g. crystalline silicon. Those skilled in the art will appreciate that the N-type region 102 is typically an n-well formed in a P-type silicon substrate. The PMOS device 100 includes a conductive floating gate (FG) electrode 104, e.g. polysilicon, that is separated from the N-type region 102 by a layer of thin gate dielectric material 106, e.g. silicon dioxide. A control gate (CG) electrode 108, e.g. polysilicon, is separated from the floating gate 104 by a layer of interpoly dielectric material 110, e.g. an oxide-nitride-oxide (ONO) sandwich. P-type diffusion regions 112 formed at the sides of the stacked gate structure provide the source/drain regions of the PMOS cell and define an N-type channel region therebetween. Those skilled in the art will appreciate that an NMOS structure can be provided with reverse polarities to the PMOS structure. The fabrication techniques available for making both the PMOS device 100 and the corresponding NMOS structure are well known.

U.S. Pat. No. 4,698,787, issued on Oct. 6, 1987, to Mukherjee et al. discloses a widely used method of erasing a non-volatile memory cell utilizing the well-known tunneling mechanism. The Mukherjee et al. electrically erasable programmable memory device includes a body of single crystalline semiconductor material having spaced-apart source and drain diffusion regions formed therein to define a channel region therebetween, a layer of gate dielectric material formed on the body, a polysilicon floating gate positioned on the gate dielectric over the channel region, a layer of interpoly dielectric formed on the floating gate, and a polysilicon control gate formed on the interpoly dielectric. The source region is formed of a deep region of a first material, e.g. phosphorous, and a shallower region of a second material, e.g. arsenic and phosphorous. The drain region is formed of a shallow region of the second material. A portion of the deep, source region underlies the gate dielectric. The first material is selected to optimize junction overlap in order to control capacitive coupling between the floating gate and the source region.

To program the Mukherjee et al. device, the drain and the control gate are raised to predetermined potentials above the potential of the source region, thereby causing "hot" electrons to be attracted through the gate dielectric to the floating gate where they are stored. To erase the device, the drain is floated and the source region is raised to a potential above that of the control gate, causing Fowler-Nordheim tunneling of electrons from the floating gate to the portion of the source region that underlies the floating gate.

Because of these programming and erasing characteristics, the Mukherjee et al. cell can be formed of a single such device without the need for a select transistor.

U.S. Pat. No. 6,137,723, issued on Oct. 24, 2000, to Bergement et al. discloses a memory array formed of EEPROM cells that use a well-to-floating gate coupled voltage during the erase operation. Each memory device in the Bergemont et al. array includes a p-channel memory transistor and an n-channel MOS access transistor.

The erasure methods of the above-identified technologies assume that high voltage is applied between the floating gate and the control gate of the memory cell to cause electrons to tunnel from the floating gate. The value of this erasure voltage is a compromise between reliability issues (if the voltage is too high) and long erasing time (if the voltage is too low). The erase voltage depends on dielectric thickness, coupling ratio, the shape of the floating gate and other factors well known to those skilled in the art. For example, the above-described Mukherjee et al. cell requires a 10–13V erase voltage applied to its control gate for 0.5–5.0 msec. Typically, for today's 0.18 micron CMOS technologies, the minimum erasing voltage is around 10V. Under these conditions, the erasing time for the cell exceeds 1 microsecond, thus providing practically a quasi-static erase operation regime.

However, obtaining the high voltage needed for erasing an EEPROM cell, given the limited supply voltage provided to the EEPROM chip, is a challenge. Usually, the typical method to increase the supply voltage is to utilize internal voltage amplification, for example, using a charge pump technique.

Based on the fact of exponential dependence of tunneling current on electric field and of the corresponding exponential dependence of erasing time on erasing voltage, the present invention provides a method of erasing an electrically erasable programmable read only memory cell using an erase signal in the frequency/time domain. For example, either a pulsed signal or an RF signal can be utilized to provide the erase control to the memory cell. The idea is to use erasing voltage that may be a few volts higher than the conventional quasi-static erase regime, but which is also a few orders of magnitude shorter in time.

Figure 2A:
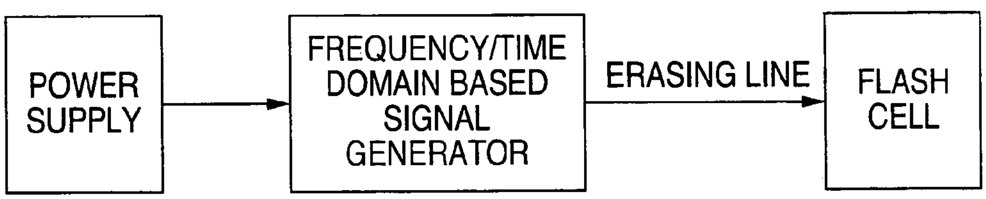
FIG. 2A is a simple block diagram illustrating a method of utilizing a frequency/time domain based erase signal in accordance with the present invention.
Figure 2B:
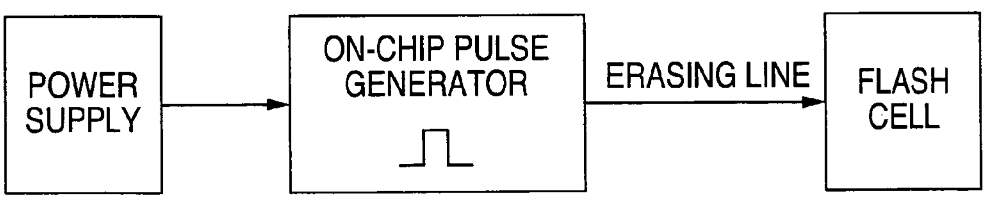
FIG. 2B is a simple block diagram illustrating a technique for the pulsed erasing of a non-volatile memory cell in accordance with the present invention.
Figure 2C:
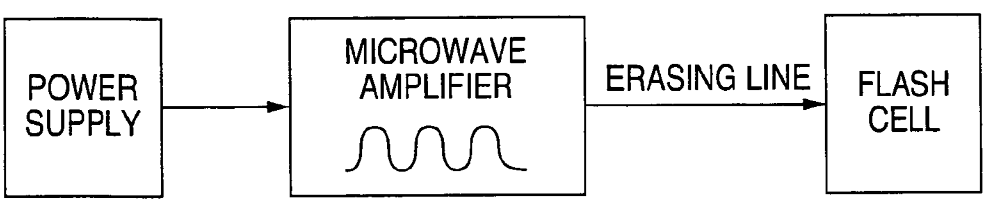
FIG. 2C is a simple block diagram illustrating a technique for the RF erasing of a non-volatile memory cell in accordance with the present invention.

Thus, a method of erasing an electrically erasable programmable read only memory cell in accordance with the present invention comprises applying a source bias voltage to the cell's source region, applying a drain bias voltage to the cell's drain region, and applying a frequency/time domain based voltage signal to the control gate electrode as the cell's erase signal, as shown in FIG. 2A. FIG. 2B shows an embodiment of the invention wherein the erase signal is a pulsed signal. FIG. 2C shows an embodiment of the invention wherein the erase signal is a radio frequency (RF) signal.

The obvious benefit of the erasing technique provided by the present invention is a shorter erasing time. Also, a variety of well-known methods are available to amplify voltage in the frequency/time domain that need less supply voltage compared to the traditional quasi-stationary technique. Third, shorter erasing times may result in less stress and reliability issues with respect to the cell structure, also allowing for reduction of dielectric thickness.

The following discussion provides an example to support the concepts of the present invention by a simulation utilizing a conventional split gate memory cell.

Figure 3:
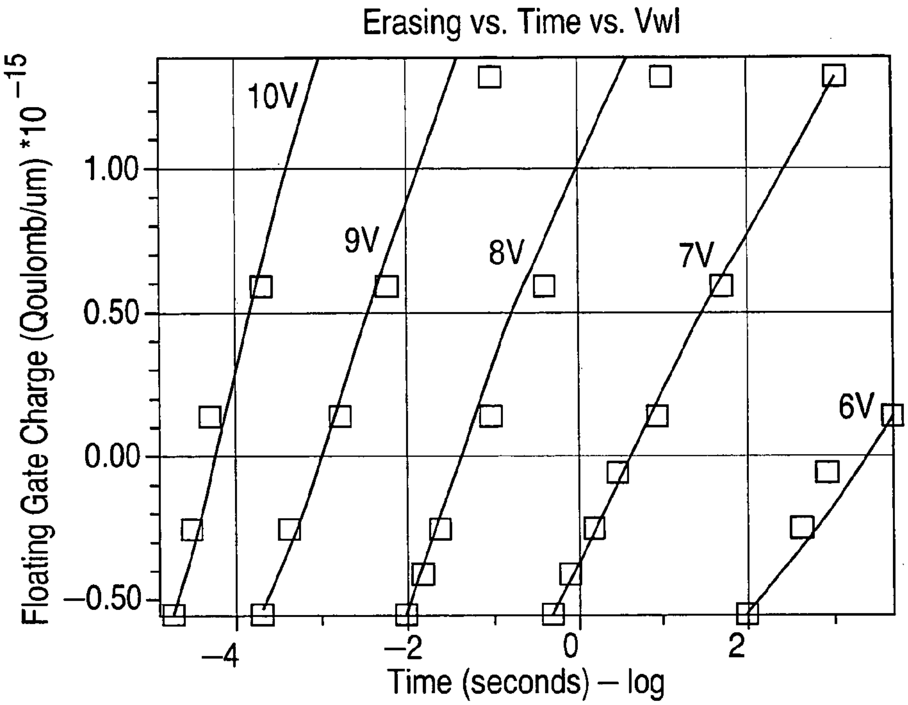
FIG. 3 is a graph illustrating floating gate charge versus erasing time versus erasing voltage.

FIG. 3 shows floating gate (FG) charge versus erasing time versus voltage. This data was extracted from experimental characteristics and used in calibration.

Figure 4A:
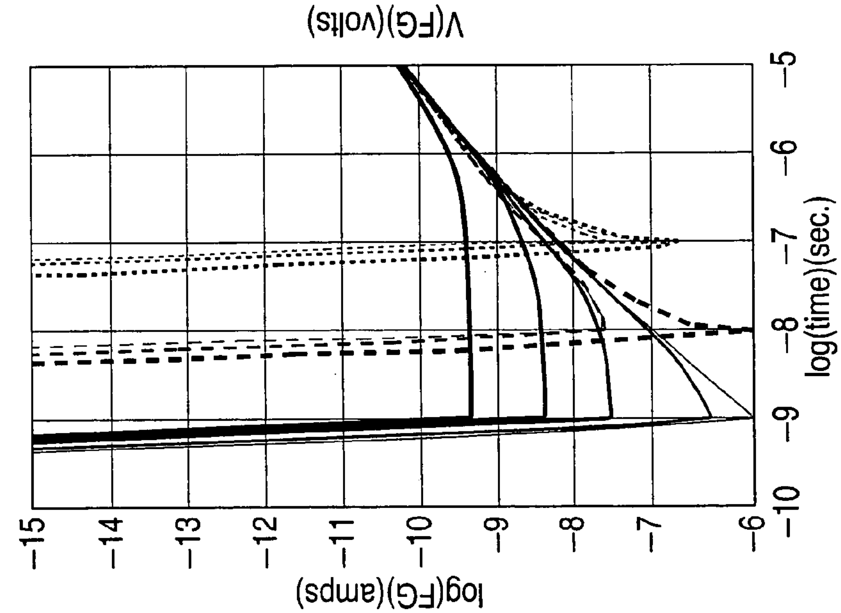
FIG. 4A is a graph illustrating erasing current versus time versus erasing voltage for a pulsed erasure technique in accordance with the present invention.
Figure 4B:
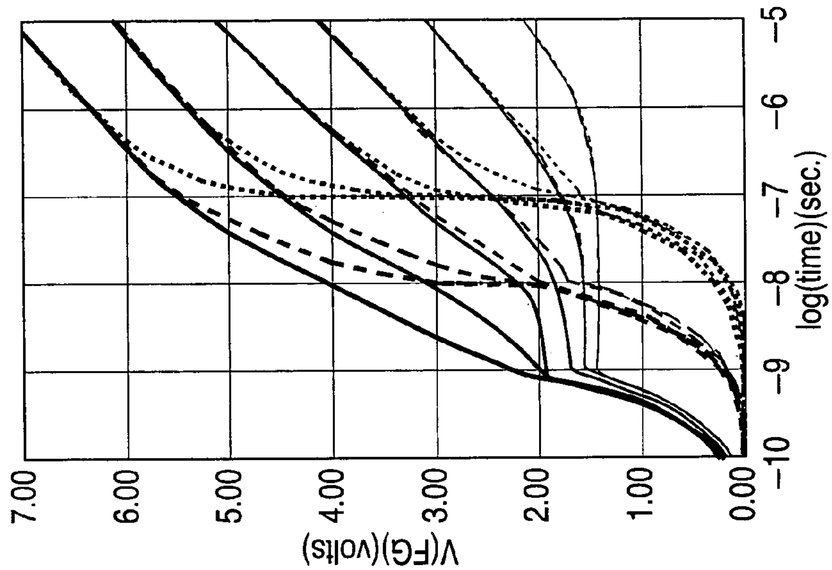
FIG. 4B is a graph illustrating floating gate voltage versus time versus erasing voltage for a pulsed erasure technique in accordance with the present invention.
Figure 4C:
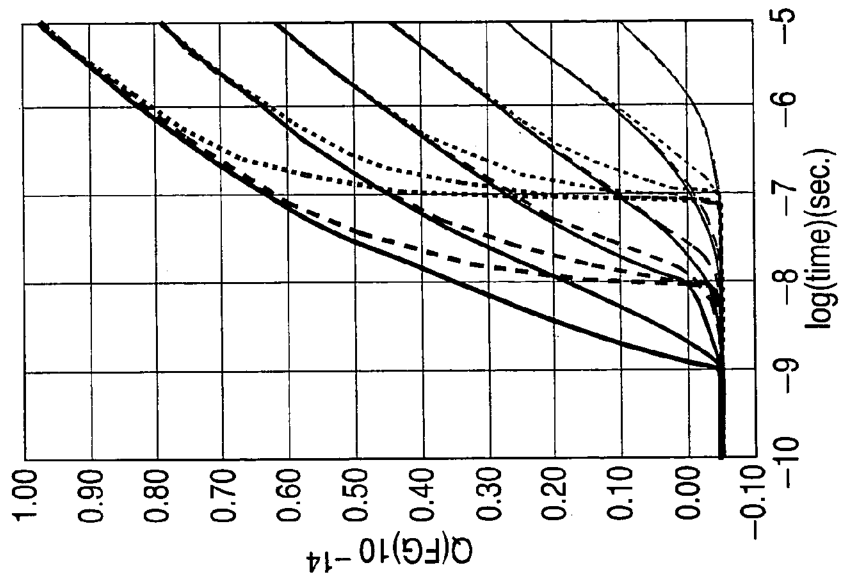
FIG. 4C is a graph illustrating floating gate charge versus time versus erasing voltage for a pulsed erasure technique in accordance with the present invention.
Figure 5C:
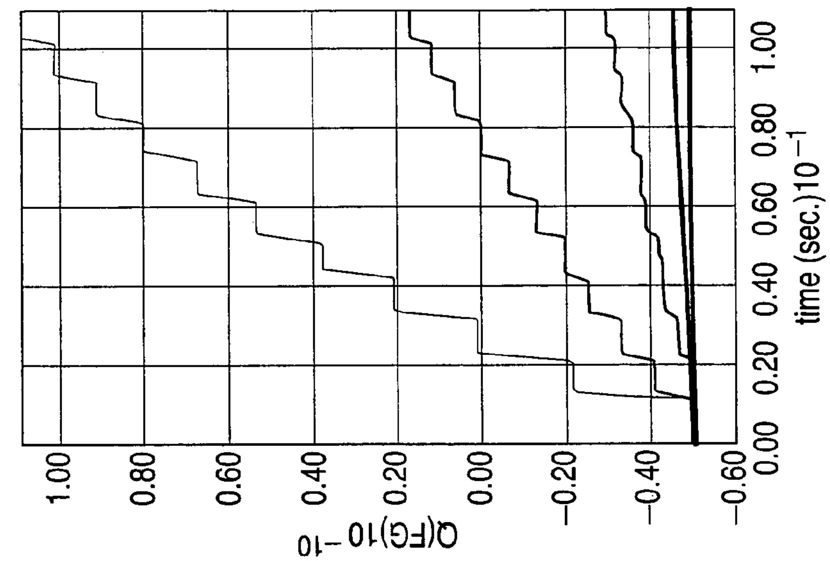
FIG. 5C is a graph illustrating floating gate charge versus time versus erasing voltage for an RF erasure technique in accordance with the concepts of the present invention.
Figure 5B:
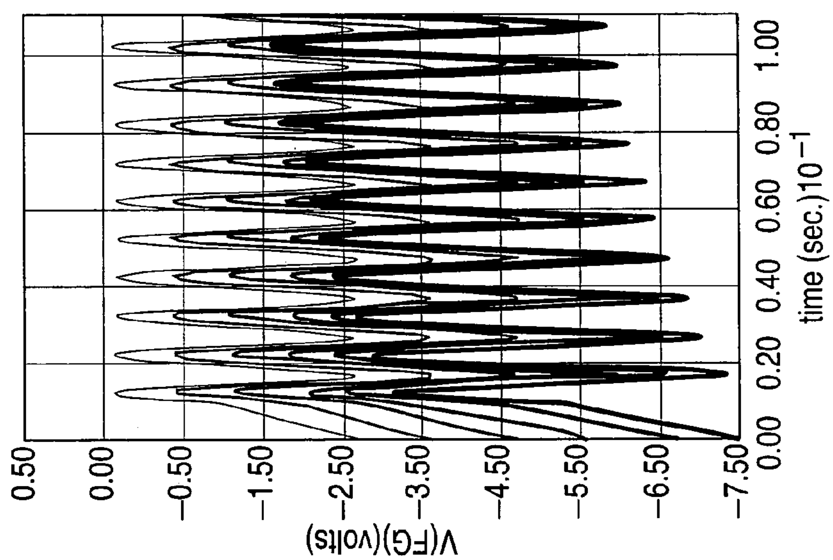
FIG. 5B is a graph illustrating floating gate voltage versus time versus erasing voltage for an RF erasure technique in accordance with the present invention.
Figure 5A:
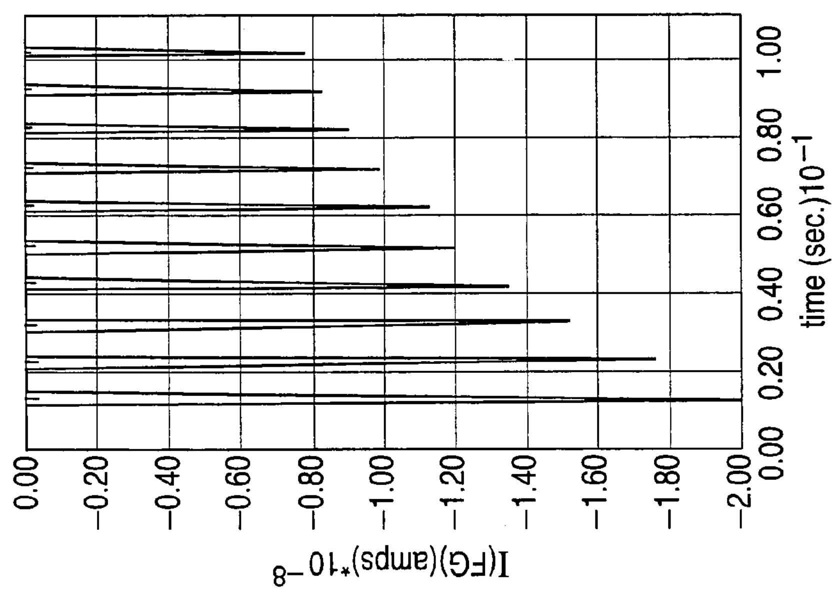
FIG. 5A is a graph illustrating erasing current versus time versus erasing voltage for an RF erasure technique in accordance with the present invention.

FIGS. 4A–4C illustrates a pulsed method in accordance with the invention. The erasing voltage is ramped from 10V to 15V within 1 ns, 10 ns and 100 ns. The plots show erasing current, floating gate voltage, and floating gate charge as functions of time and erasing voltage.

FIG. 4 illustrates an RF method in accordance with the invention. The erasing signal is ramped to half of erasing voltage within 1 ns; then it follows a sine function with frequency equal to 1e9 Hz and amplitude also equal to half of the erasing voltage.

The present invention is not limited to any specific pulse generator implementation. A key feature is conventional flash cell operation in either a pulse or RF regime with the peak erase voltage higher than the DC level obtained from the power source. This pulse or high amplitude RF source generator loaded on the erasing memory line replaces the currently-used, space-consuming charge pump circuit.

Figure 6:
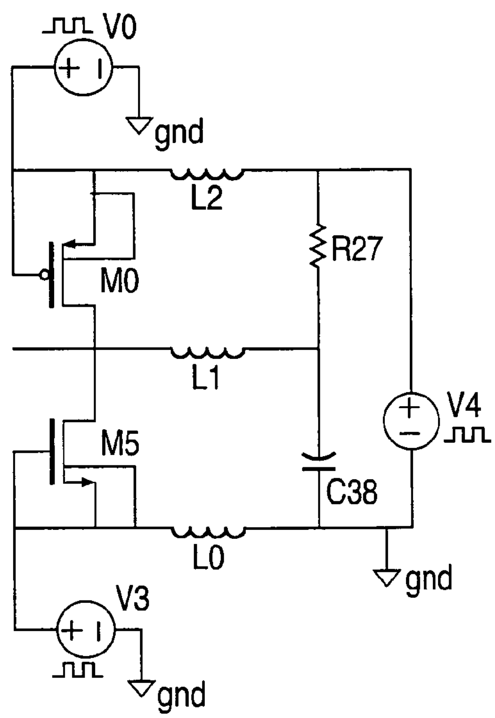
FIG. 6 is a schematic diagram illustrating a circuit for pulse generation utilizable in accordance with the present invention.
Figure 7A:
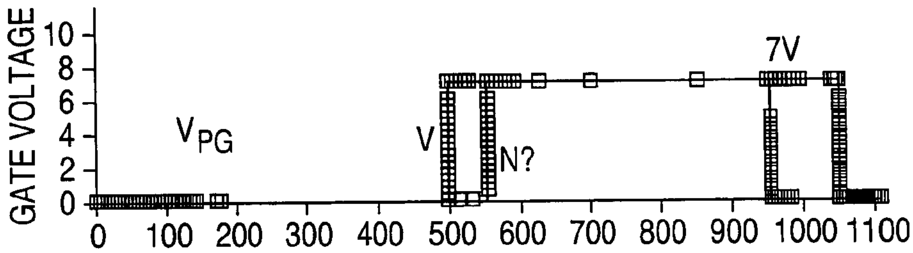
FIG. 7 provides a set of calculated waveforms demonstrating up to 13V pulsed amplitude for a 7V DC voltage source working on an inductive load for providing a frequency/time domain reassure signal for a non-volatile memory cell in accordance with the concepts of the present invention.
Figure 7B:
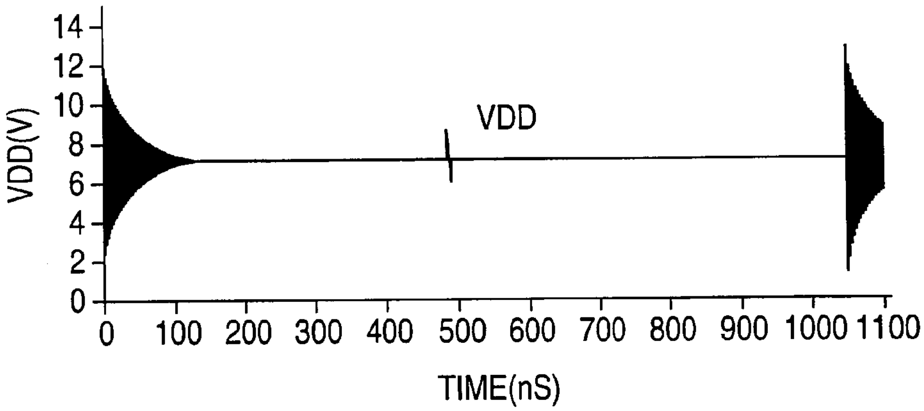
Figure 7C:
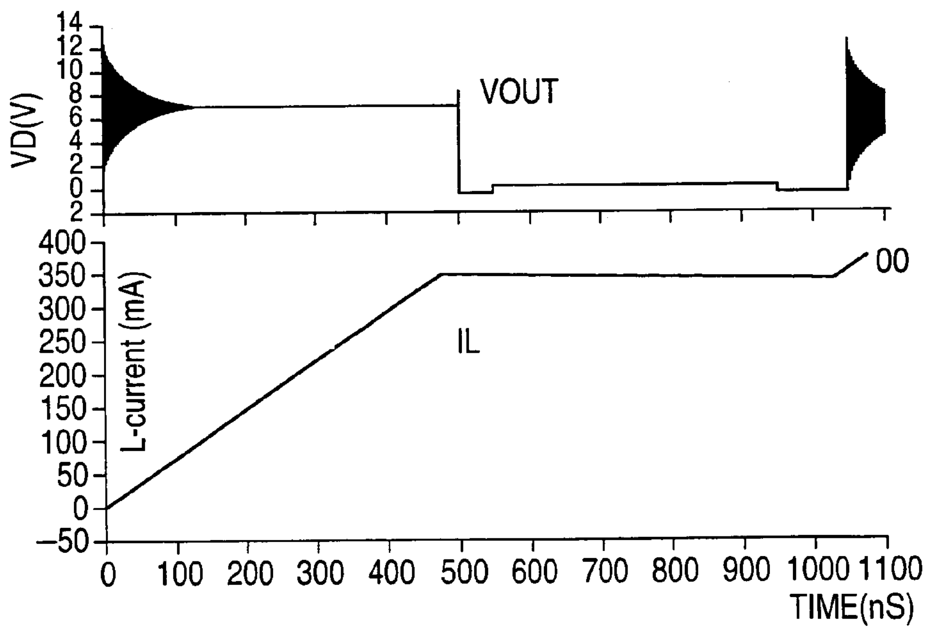

FIG. 6 shows an embodiment of a power array based pulse generator working on an inductive load; the corresponding calculated waveforms are provided in FIG. 7.

Those skilled in the art will appreciate that different types of a pulse producing circuit in accordance with the concepts of the present invention can be built using a switch loaded on an inductive load. RF signals can be obtained from a class A power amplifier that theoretically allows voltages of 2×Vdd to be obtained.

It should be understood that various alternatives to the embodiments of the invention described herein may be employed in practicing the invention. It is intended that the following claims define the scope of the invention and the methods in the scope of these claims and their equivalents be covered thereby.

What is claimed is:

1. A method of erasing an electrically erasable programmable read only memory cell that includes a source region, a drain region and control gauge electrode to which an erase signal is applied, the method comprising:

applying a source bias voltage to the source region;

applying a drain bias voltage to the drain region; and applying a radio frequency/time domain based voltage signal to the control gate electrode of the cell as the erase signal.

2. A method as in claim 1, and wherein the frequency/time domain based voltage signal comprises a pulsed signal.

3. A method as in claim 2, and wherein the amplitude of the pulsed signal is about twice the amplitude of a supply voltage signal provided to the cell.

* * * * *